US010181550B2

(12) United States Patent
Seong et al.

(10) Patent No.: US 10,181,550 B2
(45) Date of Patent: Jan. 15, 2019

(54) METHOD FOR FABRICATING HIGH-EFFICIENCY LIGHT EMITTING DIODE HAVING LIGHT EMITTING WINDOW ELECTRODE STRUCTURE

(71) Applicants: Tae Yeon Seong, Seoul (KR); Ki Seok Kim, Hwaseong-si (KR); Hwan Kyo Kim, Incheon (KR); Dae-Hyun Kim, Seoul (KR)

(72) Inventors: Tae Yeon Seong, Seoul (KR); Ki Seok Kim, Hwaseong-si (KR); Hwan Kyo Kim, Incheon (KR); Dae-Hyun Kim, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 0 days.

(21) Appl. No.: 15/628,195

(22) Filed: Jun. 20, 2017

(65) Prior Publication Data
US 2018/0019378 A1   Jan. 18, 2018

(30) Foreign Application Priority Data
Jul. 13, 2016   (KR) .......................... 10-2016-0088903

(51) Int. Cl.
| | |
|---|---|
| *H01L 33/32* | (2010.01) |
| *H01L 33/36* | (2010.01) |
| *H01L 33/38* | (2010.01) |
| *H01L 33/00* | (2010.01) |
| *H01L 33/20* | (2010.01) |

(52) U.S. Cl.
CPC ............ *H01L 33/32* (2013.01); *H01L 33/007* (2013.01); *H01L 33/36* (2013.01); *H01L 33/38* (2013.01); *H01L 33/387* (2013.01); *H01L 33/20* (2013.01); *H01L 2933/0016* (2013.01)

(58) Field of Classification Search
CPC ......... H01L 33/32; H01L 33/36; H01L 33/38; H01L 33/387
USPC ........................................................... 257/99
See application file for complete search history.

(56) References Cited

U.S. PATENT DOCUMENTS

| | | | | |
|---|---|---|---|---|
| 2007/0246716 | A1* | 10/2007 | Bhat | ...................... H01L 27/15 257/81 |
| 2013/0161585 | A1* | 6/2013 | Na | ........................ H01L 33/382 257/13 |
| 2014/0048838 | A1* | 2/2014 | Yang | .................... H01L 33/382 257/99 |

(Continued)

*Primary Examiner* — Matthew E Warren
(74) *Attorney, Agent, or Firm* — Andrew D. Fortney; Central California IP Group, P.C.

(57) ABSTRACT

A lateral light emitting diode device includes: a substrate; an n-type GaN layer disposed on the substrate; an activation layer disposed on the n-type GaN layer; a p-type GaN layer disposed on the activation layer; a current spreading layer disposed on the p-type GaN layer; a p-electrode disposed on the current spreading layer; a MESA region formed by removing portions of the current spreading layer, the p-type GaN layer, the activation layer, and the n-type GaN layer; a transparent window layer disposed on the n-type GaN layer in the entire or part of the MESA region; a plurality of contact plugs which is in contact with the n-type GaN layer through the transparent window layer; and an n-electrode disposed on the transparent window layer to connect the plurality of contact plugs to each other.

19 Claims, 13 Drawing Sheets

(56) References Cited

U.S. PATENT DOCUMENTS

2016/0126413 A1* 5/2016 Kim .................. H01L 33/06 257/13
2016/0172342 A1* 6/2016 Wu .................. H01L 27/156 257/93

* cited by examiner

METHOD FOR FABRICATING HIGH-EFFICIENCY LIGHT EMITTING DIODE HAVING LIGHT EMITTING WINDOW ELECTRODE STRUCTURE

CROSS-REFERENCE TO RELATED APPLICATIONS

This U.S. non-provisional application claims priority under 35 U.S.C. § 119 to Korea Patent Application No. 10-2016-0088903 filed on Jul. 13, 2016, the entirety of which is hereby incorporated by reference herein.

TECHNICAL FIELD

The present disclosure relates to light emitting diodes and, more particularly, to a lateral light emitting diode whose light extraction efficiency is improved by introducing an n-electrode having a light emitting window structure formed of low-refractive-index single-crystal oxide.

BACKGROUND

A light emitting diode (LED) is a semiconductor device which is capable of generating various lights through recombination of holes and electrons in a p-n junction between a p-type semiconductor and an n-type semiconductor when current is applied.

In the case of a light emitting diode device, current crowing occurs in a specific portion due to the characteristic of a wafer where p-type and n-type semiconductor materials are epitaxially grown. This results from an intrinsic property of a material having a different mobility than holes and electrons in the p-type and the n-type semiconductor materials.

A lateral light emitting diode has a MESA structure formed by performing anisotropic plasma etching on a wafer, where substrate/n-GaN/MQW/p-GaN are sequentially and epitaxially grown, to form an n-electrode. Since the etching is performed down to n-GaN, a MESA region corresponds to a non-emission region in which a light is not generated due to loss of an activation layer MQW. A MESA step causes an effect that a light traveling to the MESA is not extracted and is confined.

Mostly, a Ti/Al or Cr/Al-based electrode is widely used as an n-electrode of a lateral light emitting diode. The n-electrode is opaque, which prevents a light confined in a device from being emitting through the MESA region that is a non-emission region. Thus, light extraction efficiency is reduced.

A light of a gallium nitride light emitting diode is generated in a multi-quantum well (MQW) and exposed to the outside through gallium nitride. A critical angle is reduced due to a great difference between gallium nitride (refractive index=2.4) and air (refractive index=1). Thus, the light cannot be emitted to the outside and is totally reflected at the boundary to be confined therein. In particular, an indium tin oxide (ITO) layer (refractive index=1.9) is grown at an upper end of P—GaN as a current spreading layer to help light extraction. However, in the case of a MESA region and a side portion of an LED chip, a structure which may resolve a difference in refractive index is not formed. Thus, except for light emitted to a non-emission region and a side surface, only part of generated light is extracted, which causes light efficiency of the light emitting diode to be reduced.

To improve low light extraction efficiency, various technologies such as flip-chip structure, patterned sapphire substrate (PSS), photonic crystal technology, and anti-reflection layer have been applied. It is essential to improve light efficiency of a light emitting diode, and there is a need for continuous studies to improve the light extraction efficiency.

SUMMARY

A feature of the present disclosure is to maximize extraction efficiency of a light lost in a MESA region. In order to achieve the feature, a light which is not emitted through a non-emission region and is confined in a device is extracted by introducing an electrode having a light emitting window.

Another feature of the present disclosure is to suppress a current crowding phenomenon that current is crowded in a certain region of a device due to a substrate characteristic of the device. In order to achieve the feature, a non-uniform via hole contact is formed to provide current spreading effect.

A lateral light emitting diode device according to an example embodiment of the present disclosure includes: a substrate; an n-type GaN layer disposed on the substrate; an activation layer disposed on the n-type GaN layer; a p-type GaN layer disposed on the activation layer; a current spreading layer disposed on the p-type GaN layer; a p-electrode disposed on the current spreading layer; a MESA region formed by removing portions of the current spreading layer, the p-type GaN layer, the activation layer, and the n-type GaN layer; a transparent window layer disposed on the n-type GaN layer in the entire or part of the MESA region; a plurality of contact plugs which is in contact with the n-type GaN layer through the transparent window layer; and an n-electrode disposed on the transparent window layer to connect the plurality of contact plugs to each other. The current spreading layer, the p-type GaN layer, and the activation layer are vertically aligned with each other to provide an emission region.

In an example embodiment, a top surface of the transparent window layer may be higher than the current spreading layer.

In an example embodiment, the lateral light emitting diode device may further include at least one of: an insulating sidewall disposed on a side surface of the transparent window at the boundary of the MESA region and the emission region; and a seed layer interposed between the n-type GaN layer and the transparent window layer.

In an example embodiment, the transparent window layer may include at least one selected from the group consisting of oxides such as zinc oxide (ZnO), zirconium oxide ($ZrO_2$), titanium oxide ($TiO_2$), chrome oxide ($Cr_2O$), indium tin oxide (ITO), indium zinc oxide (IZO), indium zinc tin oxide (IZTO), indium oxide ($In_2O_3$), tin oxide ($SnO_2$), silicon oxide ($SiO_2$), magnesium fluoride ($MgF_2$), and a combination thereof.

In an example embodiment, the n-electrode and the MESA region may extend in a first direction. The plurality of contact plugs may be arranged in the first direction, and a distance between the contact plugs may be sequentially reduced as proceeding in the first direction.

In an example embodiment, the transparent window layer may have a multilayer structure having a sequentially reduced refractive index.

In an example embodiment, the MESA region may include a peripheral MESA region disposed to cover the emission region and an n-electrode MESA region crossing the emission region. The transparent window layer may be disposed only in the n-electrode MESA region.

A method for fabricating a lateral light emitting diode device according to an example embodiment of the present disclosure includes: sequentially stacking an n-type GaN layer, an activation layer, a p-type GaN layer, and a current spreading layer on a substrate; anisotropically etching and removing portions of the current spreading layer, the p-type GaN layer, the activation layer, and the n-type GaN layer by using a patterning process to form a MESA region; forming an insulating sidewall on a sidewall of an emission region including portions of the current spreading layer, the p-type GaN layer, the activation layer, and the n-type GaN layer; forming a seed layer on the n-type GaN layer exposed in the MESA region; growing a transparent window layer on the seed layer in a crystal state; forming a plurality of contact plugs to be in contact with the n-type GaN layer through the transparent window layer and the seed layer; forming an n-electrode on the transparent window layer to connect the plurality of contact plugs to each other; and forming a p-electrode on the current spreading layer.

In an example embodiment, the transparent window layer may include metal oxide which is one selected from the group consisting of zinc oxide (ZnO), zirconium oxide ($ZrO_2$), titanium oxide ($TiO_2$), chrome oxide ($Cr_2O$), indium tin oxide (ITO), indium zinc oxide (IZO), indium zinc tin oxide (IZTO), indium oxide ($In_2O_3$), and tin oxide ($SiO_2$).

In an example embodiment, the transparent window layer may be grown by hydrothermal deposition.

A method for fabricating a lateral light emitting diode device according to another example embodiment of the present disclosure includes: sequentially stacking an n-type GaN layer, an activation layer, a p-type GaN layer, and a current spreading layer on a substrate; anisotropically etching and removing portions of the current spreading layer, the p-type GaN layer, the activation layer, and the n-type GaN layer by using a patterning process to form a MESA region; depositing a transparent window layer on the substrate including the MESA region and forming the transparent window layer only in the MESA region by using a patterning process; forming a plurality of contact plugs to penetrate the transparent window layer; forming an n-electrode on the transparent window layer to connect the plurality of contact plugs to each other; and forming a p-electrode on the current spreading layer.

In an example embodiment, the transparent window layer may include silicon oxide, silicon nitride or magnesium fluoride.

BRIEF DESCRIPTION OF THE DRAWINGS

The present disclosure will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the present disclosure.

DETAILED DESCRIPTION

Figure 1A:
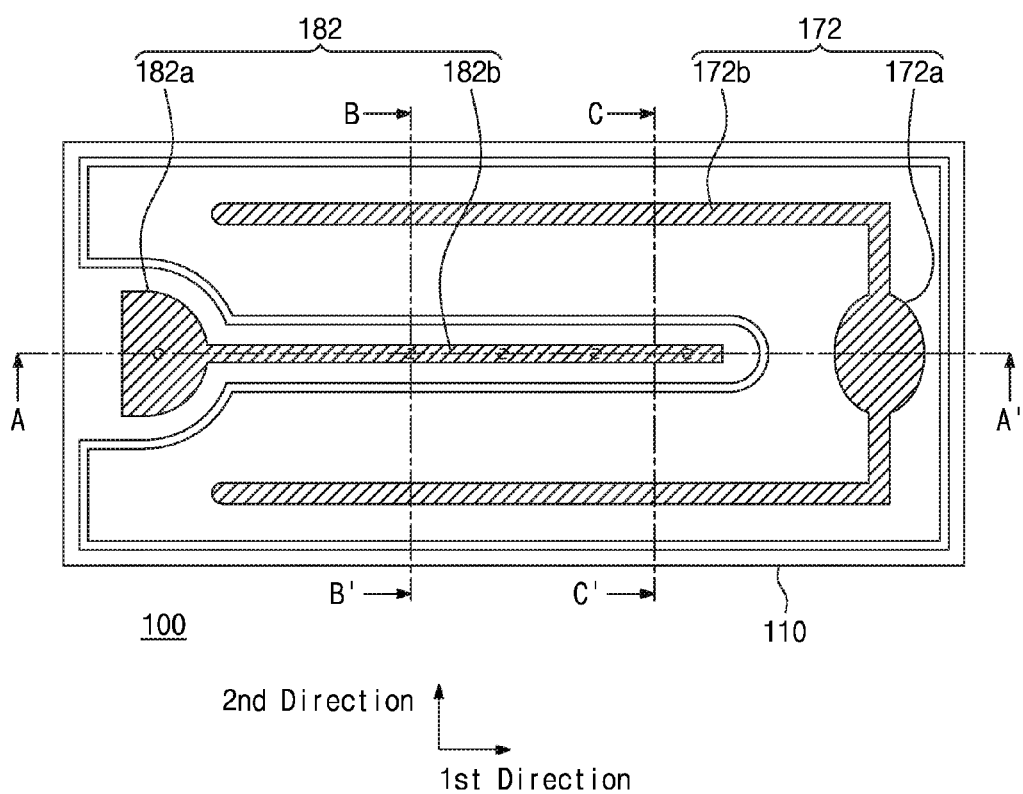
FIG. 1A is a top plan view of a lateral light emitting diode device according to an example embodiment of the present disclosure.

In a conventional nitride-based vertical/lateral light emitting diode structure, a MESA is formed to cause loss of an emission region and formation of a non-emission region. The non-emission region is formed at a lower step than the light-emitting region by etching the MESA.

According to an example embodiment of the present disclosure, a transparent window layer is disposed in a non-emission region to waveguide a light that is not emitted through the non-emission region. The waveguided light may be extracted through the transparent window.

To maximize an effect caused by the waveguide, a height of the transparent window layer should be greater than the MESA step. A wide angle of beam spread of a device may be controlled by adjusting the height of the transparent window layer.

The transparent window layer may be selectively and epitaxially grown based on a seed layer. In this case, the transparent window layer may include a zinc oxide (ZnO) crystal. In particular, when a ZnO oxide-based material is adopted as the transparent window layer, the seed layer may be grown in a selective region (MESA region) by hydrothermal deposition after being selectively formed.

The transparent window layer is formed by wet etching or dry etching after being deposited by plasma-enhanced chemical vapor deposition (PECVD), evaporation or RF sputtering. The transparent window layer is selectively formed in the MESA region through photolithography.

When transparent conductive metal oxide having a conductivity is used as the transparent window layer, the transparent conductive metal oxide may be formed in the entire MESA-etched region and an n-type semiconductor region and a p-type semiconductor region may come in contact with each other through the transparent conductive metal oxide to be electrically shorted to each other. Thus, an insulating sidewall is formed at the boundary of the MESA region. The insulating sidewall may employ a material having a value between a refractive index of the transparent window layer and a refractive index of the gallium nitride such that light extraction may be smoothly performed. Alternatively, when the insulating sidewall is thin, refractive index matching effect is negligible.

An n-type GaN layer and an external wiring may be connected to each other by applying a via contact hole technique. A contact plug filling a via hole may include a metal material that has a high reflectivity characteristic in a wavelength band desired to be applied and forms a low-resistance ohmic contact with the n-type GaN layer. Specifically, the contact plug may include at least one of Al, Cr/Al, Cr/Al/Ti/Au, Cr/Al/Ni/Au Ti/Al/Ti/Au, and Ti/Al/Ni/Au.

The contact plug may be aluminum (Al), Al alloy, silver (Ag), Ag alloy, rhodium (Rh) or Rh alloy. An n-electrode may be a material having a reflectivity of 90 percent or more in a light-emitting wavelength band of a light emitting diode.

When the via hole contact is formed, current crowding effect may be reduced by non-uniformly forming a distance between contact plugs. As far away from a position into which current is injected, the distance between contact plugs may decrease.

An n-electrode connecting the contact plugs may be formed of the same material as the contact plug and may be formed simultaneously with the contact plug.

The advantages and features of the present disclosure and methods of achieving them will be apparent from the following exemplary embodiments that will be described in more detail with reference to the accompanying drawings. It should be noted, however, that the present disclosure is not limited to the following exemplary embodiments, and may be implemented in various forms. Accordingly, the exemplary embodiments are provided only to disclose examples of the present disclosure and to let those skilled in the art understand the nature of the present disclosure.

In the specification, it will also be understood that when an element or lines are referred to as being "on" a target element block, it can be directly on the target element block, or intervening another element may also be present. In the drawings, thicknesses of elements are exaggerated for clarity of illustration.

The terms used in the specification are for the purpose of describing particular embodiments only and are not intended to be limiting of the invention. As used in the specification, the singular forms "a", "an" and "the" are intended to include the plural forms as well, unless the context clearly indicates otherwise. It will be further understood that the terms "comprises" and/or "comprising", when used in the specification, specify the presence of stated features, integers, steps, operations, elements, and/or components, but do not preclude the presence or addition of one or more other features, integers, steps, operations, elements, components, and/or groups thereof.

Each embodiment described and exemplified herein may include a complementary embodiment thereof.

Example embodiments will now be described more fully with reference to the accompanying drawings, in which some example embodiments are shown. Example embodiments may, however, be embodied in many different forms and should not be construed as being limited to the embodiments set forth herein; rather, these example embodiments are provided so that this disclosure will be thorough and complete, and will fully convey the scope of example embodiments of the present disclosure to those of ordinary skill in the art. In the drawings, the thicknesses of layers and regions are exaggerated for clarity. Like reference characters and/or numerals in the drawings denote like elements, and thus their description may be omitted.

FIG. 1A is a top plan view of a lateral light emitting diode device according to an example embodiment of the present disclosure.

Figure 1B:
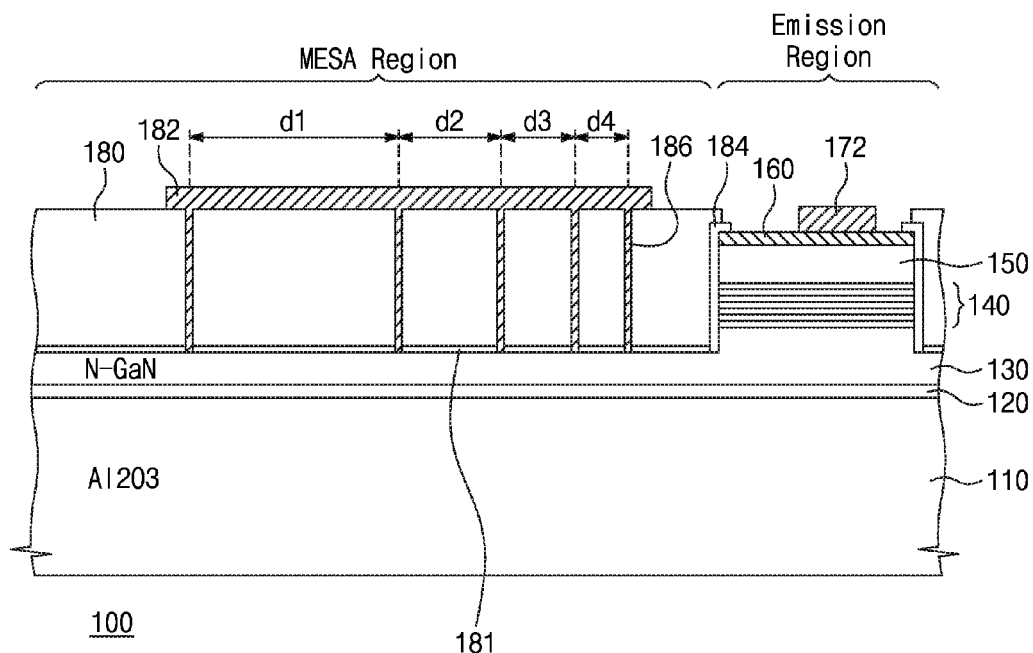
FIG. 1B is a cross-sectional view taken along a line A-A' in FIG. 1A.

FIG. 1B is a cross-sectional view taken along a line A-A' in FIG. 1A.

Figure 1C:
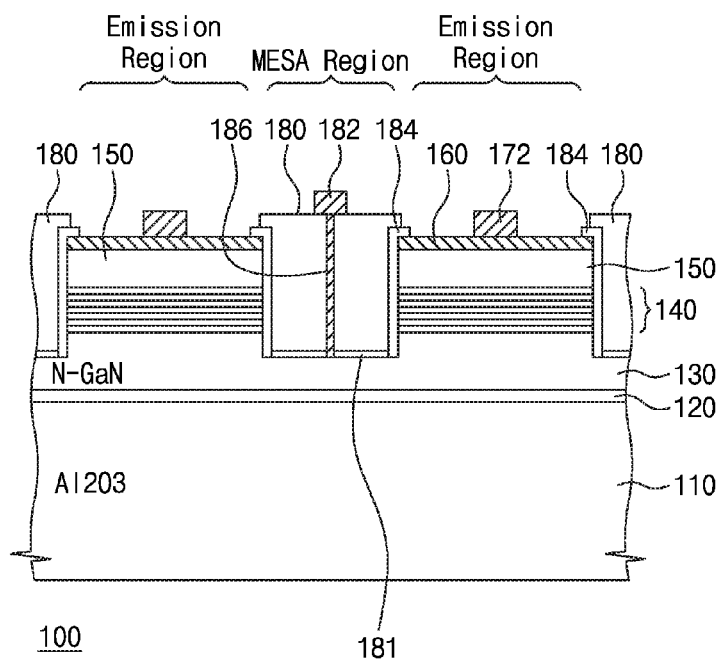
FIG. 1C is a cross-sectional view taken along a line B-B' in FIG. 1A.

FIG. 1C is a cross-sectional view taken along a line B-B' in FIG. 1A.

Figure 1D:
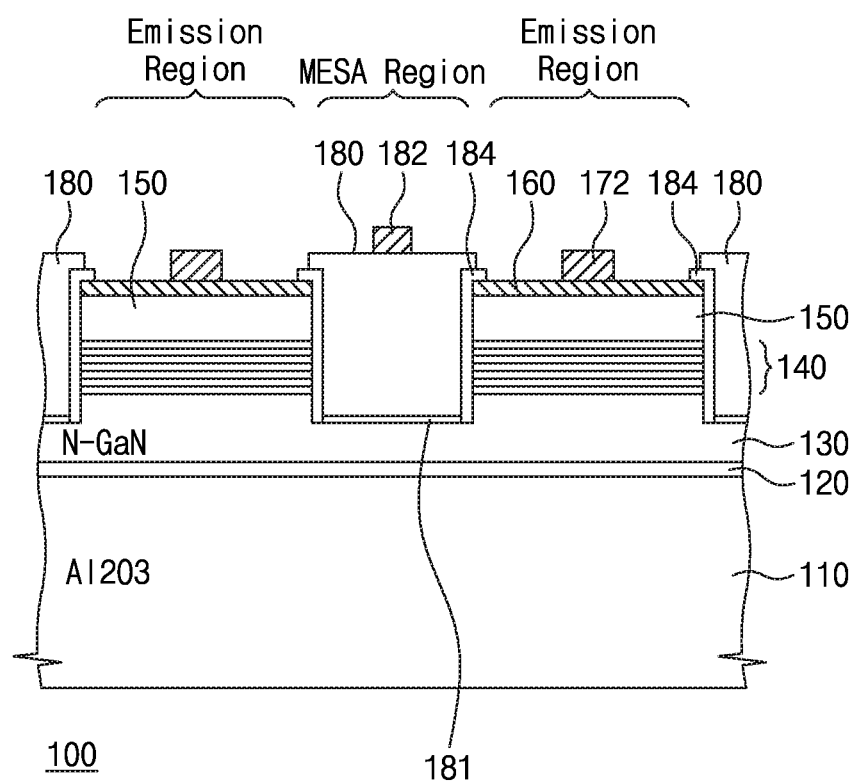
FIG. 1D is a cross-sectional view taken along a line C-C' in FIG. 1A.

FIG. 1D is a cross-sectional view taken along a line C-C' in FIG. 1A.

Referring to FIGS. 1A to 1D, a lateral light emitting diode device 100 includes: a substrate 110; an n-type GaN layer 130 disposed on the substrate 110; an activation layer 140 disposed on the n-type GaN layer 130; a p-type GaN layer 150 disposed on the activation layer 140; a current spreading layer 160 disposed on the p-type GaN layer 150; a p-electrode 172 disposed on the current spreading layer 160; a MESA region formed by removing portions of the current spreading layer 160, the p-type GaN layer 150, the activation layer 140, and the n-type GaN layer 130; a transparent window layer 180 disposed on the n-type GaN layer 130 in the entire or part of the MESA region; a plurality of contact plugs 186 which is in contact with the n-type GaN layer 130 through the transparent window layer 180; and an n-electrode 182 disposed on the transparent window layer 180 to connect the plurality of contact plugs 186 to each other. The current spreading layer 160, the p-type GaN layer 150, and the activation layer 140 are vertically aligned with each other to provide an emission region.

The substrate 110 is provided to epitaxially grow compound semiconductors such as the n-type GaN layer 130, the activation layer 140, and the p-type GaN layer 150. The substrate 110 may have similar crystal structure and orientation to the compound semiconductor layers. The substrate 110 may change into a transparent substrate such as sapphire, silicon carbide (SiC), aluminum nitride (AlN), or silicon.

A buffer layer 120 may be disposed on the substrate 110. The buffer layer 120 may include undoped gallium nitride (GaN). The buffer layer 120 reduces a difference in grating constant between the substrate 110 and the n-type GaN layer 130. The buffer layer 120 serves to relieve stress between the substrate 110 and the n-type GaN layer 130.

The n-type GaN layer 130 is deposited on the buffer layer 120. An n-type impurity may be silicon (Si).

The activation layer 140 is deposited on the n-type GaN layer 130. In the activation layer 140, electrons injected in the n-type GaN layer 120 and holes injected in the p-type GaN layer 150 are combined with each other. The activation layer 140 emits a light of a wavelength corresponding to a band gap difference depending on a material constituting the activation layer 140. The activation layer 140 may be a double heterostructure, a single quantum well or multiple quantum wells. In the case that the lateral light emitting diode device 100 is a blue or green LED, the multiple quantum wells may be an InGaN/GaN structure. In the case of ultraviolet, the multiple quantum wells may be AlGaN/InGaN structure.

An electron blocking layer (EBL, not shown) may be additionally disposed on the activation layer 140. The electron blocking layer blocks electrons that are injected from the n-type GaN layer 130 and pass the activation layer 140. The electron blocking layer provides holes injected in the p-type GaN layer 150 to the activation layer 140 after allowing the holes to pass therethrough. The electron blocking layer may improve recombination of the electrons and the holes. The electron blocking layer is AlGaN doped with p-type impurity.

The p-type GaN layer 150 may be disposed on the activation layer 140 or the electron blocking layer (not shown). A p-type impurity may be magnesium (Mg).

The current spreading layer 160 is disposed on the p-type GaN layer 150. The current spreading layer 160 may be transparent conductive metal oxide. The current spreading layer 150 may uniformly provide current to the p-type GaN layer 150 to provide light emission in the entire area of the activation layer 140. The current spreading layer 160 may be indium tin oxide (ITO) or tin oxide ($SnO_2$). The current spreading layer 160 may have a transparent characteristic, a sufficiently low sheet resistance characteristic, and a characteristic to form an ohmic contact with the p-type GaN layer 150. In general, the current spreading layer 160 may be formed to be sufficient thin to the level of several tens of nanometers to have a sufficient transmittance.

The p-electrode 172 may be disposed on the current spreading layer 160. Conventionally, when the p-electrode 172 is disposed on the current spreading layer 160, the p-electrode 172 may be formed of a metal and may operate as an electrode pad for wire connection while operating as an electrode. The p-electrode 172 may include a p-electrode pad 170a electrically connected to the outside by a wire and a p-electrode finger 170b branching from the p-electrode pad 170a. After branching into two parts at the p-electrode pad 172a and extending in a second direction, the p-electrode finger 172b may extend in a first direction. On a disposition plane of an LED device, the first direction means a horizontal direction in which an n-electrode pad and a p-electrode pad are connected to each other and the second direction means a direction perpendicular to the first direction. The p-electrode 172 may be Ti or Cr-based multilayer structure such as Ni/Au, Ti/Al, Ti/Al/Ni/Au, Cr/Al or Cr/Al/Ni/Au.

The lateral light emitting diode device 100 has a MESA structure in which portions of the current spreading layer 160, the p-type GaN layer 150, the activation layer 140, and the n-type GaN layer 130 are removed. The MESA region may include a peripheral MESA region whose circumference is removed at the current spreading layer 160, the p-type GaN layer 150, and the activation layer 150 and an n-electrode MESA region in which the n-electrode 182 is to be disposed. The n-electrode MESA region may extend in a first direction. Thus, an n-electrode finger 182b and the p-electrode finger 172b may extend parallel to each other in the first direction.

A seed layer 181 may be used for selective crystal growth of the transparent window layer 180. The seed layer 181 is formed on the exposed n-type GaN layer 130 in the MESA region. The seed layer 181 may be deposited by patterning a photoresist mask using a lift-off process and performing a sputtering process on the photoresist mask. After formation of the seed layer 181, the photoresist mask may be removed. The seed layer 181 may operate as a seed for the crystal growth of the transparent window layer 180. A thickness of the seed layer 181 may be between 30 and 200 nm. The seed layer 181 may be the same or similar material as the transparent window layer 180 and may be a transparent material through which a light can pass.

The transparent window layer 180 may be disposed on the n-type GaN layer or the seed layer 181 in the entire or part of the MESA region. A top surface of the transparent window layer 180 may be higher than the current spreading layer 160. Thus, a light traveling along a side surface of the emission region may be emitted to the outside through an insulating sidewall 184 and the transparent window layer 180.

When gallium nitride comes in direct contact with air, a light impinging to the air from the gallium nitride layer has a small critical angle (about 30 degrees). Thus, among the light impinging from the gallium nitride layer to the air, a light impinging at the critical angle or more is totally reflected to be confined in the emission region and to be lost. However, according to an example embodiment of the present disclosure, the side surface of the emission region is surrounded by an insulating sidewall of a transparent material. In addition, the MESA region is filled with a transparent window layer of a transparent material. Accordingly, the light traveling to the insulating sidewall and the transparent window layer from the gallium nitride layer has a great critical angle (greater than 30 degrees). As a result, a light generated at the activation layer may be extracted to the outside through the transparent window layer to improve light extraction efficiency. In the MESA region, a light impinging to the transparent window layer from the n-type GaN layer may have a great critical angle to improve light extraction efficiency.

The transparent window layer 180 may be grown in a crystal state based on the seed layer 181. A material of the transparent window layer 180 may include one selected from the group consisting of zinc oxide (ZnO), zirconium oxide ($ZrO_2$), titanium oxide ($TiO_2$), chrome oxide ($Cr_2O$), indium zinc oxide (IZO), indium zinc tin oxide (IZTO), indium oxide ($In_2O_3$), and tin oxide ($SnO_2$). The transparent window layer 180 is grown by a process such as metal organic chemical vapor deposition (MOCVD), hydrothermal deposition, and electrochemical deposition. When the material of the transparent window layer 180 is zinc oxide (ZnO), the zin oxide (ZnO) may be selectively grown on the seed layer 181 by hydrothermal deposition.

According to a modified embodiment of the present disclosure, the transparent window layer 180 may be directly deposited on the n-type GaN layer 130 without using the seed layer 181. The transparent window layer 180 may have a multiplayer structure having a sequentially reduced refractive index. Thus, refractive index matching may be performed to further improve light extraction efficiency. When selective crystal growth is not performed, dry etching or wet etching may be performed to pattern the transparent window layer 180.

The insulating sidewall 184 may be disposed on a side surface of the transparent window layer 180 at the boundary of the MESA region and the emission region. Accordingly, when the transparent window layer 180 is transparent conductive metal oxide, the insulating sidewall 184 may block an electrical connection between the n-type GaN layer 130 and the emission region. A refractive index of the insulating sidewall 184 may have a value between a refractive index of the transparent window layer 180 and a refractive index of the gallium nitride. However, the refractive index of the insulating sidewall 184 is not limited thereto and refractive index matching may be disregarded when the insulating sidewall 184 is sufficiently thin. When the refractive index matching is disregarded, the insulating sidewall 184 may include silico oxide, silicon nitride or magnesium fluoride.

The plurality of contact plugs 186 are in contact with the n-type GaN layer 130 through the transparent window layer 180. The contact plug 186 may be formed by forming a via hole and filling the via hole with a metal. A distance between the contact plugs 186 may sequentially decrease as proceeding in the first direction. Thus, current supplied through an n-electrode pad 182a may be spatially distributed to uniformly flow. The contact plug 186 may be a metal that may be in ohmic contact with the n-type GaN layer 130. Specifically, the contact plug 186 may have a Cr/Au structure, a Cr/Al/Pt/Au structure, a Ti/Au structure, a Ti/Al structure or a Ti/Al/Ni/Au structure. The contact plug 186 may be formed simultaneously with the n-electrode 182. The contact plug 186 and the n-electrode 182 may be simultaneously formed by a lift-off process.

The n-electrode 182 is disposed on the transparent window layer 180 and connects the contact plug 186. The n-electrode 182 may extend on the transparent window layer 180 in a first direction. The n-electrode 182 may include an n-electrode pad 182a and the n-electrode finger 182b. The n-electrode pad 182a may be disposed opposite to the p-electrode pad 172a. The n-electrode pad 182a may be disposed on the n-electrode MESA region. The n-electrode finger 182b may extend from the n-electrode pad 182a in the first direction. The n-electrode 182 may have a Cr/Au structure, a Cr/Al/Pt/Au structure, a Ti/Au structure, a Ti/Al structure or a Ti/Al/Ni/Au structure.

According to a modified embodiment of the present disclosure, the transparent window layer 180 may have a multilayer structure. The transparent window layer 180 may have a structure having a sequentially reduced refractive index. For example, the transparent window layer 180 may have a multilayer structure of ZnO(refractive index=1.94)/ITO(refractive index=1.89)/SiN(refractive index=1.63)/SiO (refractive index=1.54).

FIGS. 2A to 2G are cross-sectional views illustrating processes of fabricating a lateral light emitting diode device according to an example embodiment of the present disclosure.

A method for fabricating a lateral light emitting diode device according to an example embodiment of the present disclosure includes: sequentially stacking an n-type GaN layer 130, an activation layer 140, a p-type GaN layer 150, and a current spreading layer 160 on a substrate 110; anisotropically etching and removing portions of the current spreading layer 160, the p-type GaN layer 150, the activation layer 140, and the n-type GaN layer 130 by using a patterning process to form a MESA region; forming an insulating sidewall 184 on a sidewall of an emission region including portions of the current spreading layer 160, the p-type GaN layer 150, the activation layer 140, and the n-type GaN layer 130; forming a seed layer 181 on the n-type GaN layer 130 exposed in the MESA region; growing a transparent window layer 180 on the seed layer 181 in a crystal state; forming a plurality of contact plugs 186 to be in contact with the n-type GaN layer 130 through the transparent window layer 180 and the seed layer 181; forming an n-electrode 182 on the transparent window layer 180 to connect the plurality of contact plugs 186 to each other; and forming a p-electrode 172 on the current spreading layer 160. The transparent window layer 180 may include one selected from the group consisting of metal oxides such as zinc oxide (ZnO), zirconium oxide ($ZrO_2$), titanium oxide ($TiO_2$), chrome oxide ($Cr_2O$), indium zinc oxide (IZO), indium zinc tin oxide (IZTO), indium oxide ($In_2O_3$), and tin oxide ($SiO_2$).

Figure 2A:
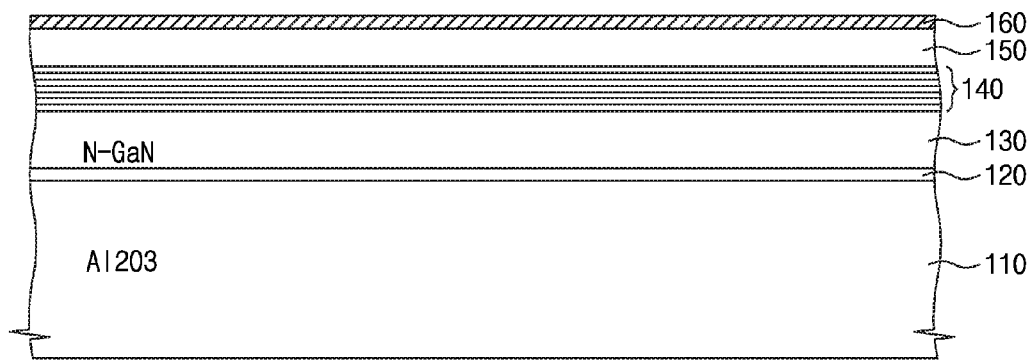
FIGS. 2A to 2G are cross-sectional views illustrating processes of fabricating a lateral light emitting diode device according to an example embodiment of the present disclosure.

Referring to FIG. 2A, the n-type GaN layer 130, the activation layer 140, and the p-type GaN layer 150 are sequentially grown on the substrate 110. Before the n-type GaN layer 150 is grown on the substrate 110, a buffer layer 120 may be grown on the substrate 110. The buffer layer 120 reduces a difference in grating constant between the substrate 110 and the n-type GaN layer 130. The buffer layer 120 serves to relieve stress between the substrate 110 and the n-type GaN layer 130. The buffer layer 120, the n-type GaN layer 130, the activation layer 140, and the p-type GaN layer 150 may be grown by a deposition process such as metal-organic chemical vapor deposition (MOCVD), molecular beam epitaxy (MBE) or hydride vapor phase epitaxy (HVPE).

After the p-type GaN layer 150 is deposited, the current spreading layer 160 is deposited on the p-type GaN layer 150. The current spreading layer 160 is deposited on the p-type GaN layer 150 by a sputtering process.

Figure 2B:
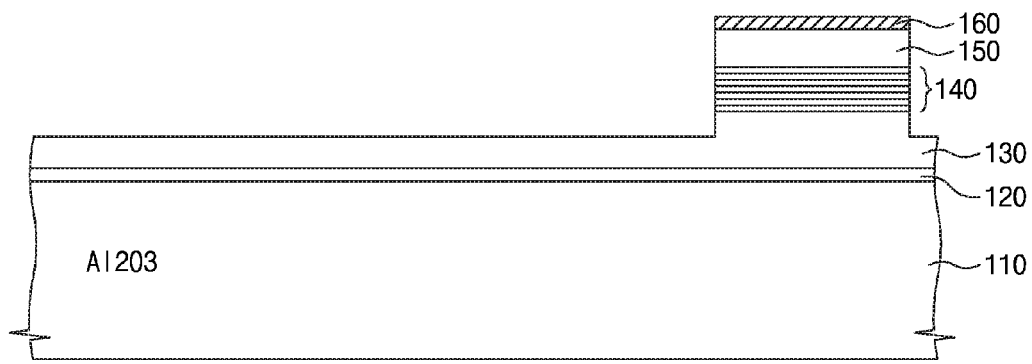

Referring to FIG. 2B, a photoresist (PR) pattern is formed on the current spreading layer 160. Portions of the p-type GaN layer 150 and the n-type GaN layer 130 are patterned using the photoresist pattern as an etching mask. A plasma anisotropic etching process is performed to form a MESA region and a MESA structure. After the patterning, the photoresist pattern is removed.

Figure 2C:
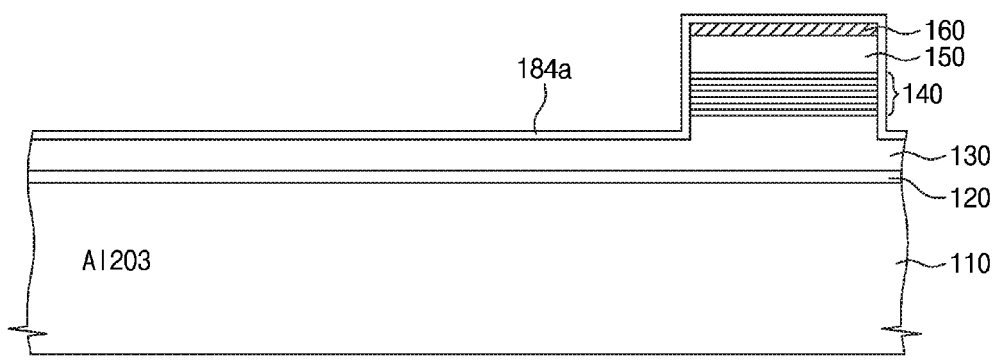

Referring to FIG. 2C, an insulating sidewall material 184a is deposited by a chemical vapor deposition (CVD) process. The insulating sidewall material 184a may include silicon oxide, silicon nitride or magnesium fluoride.

Figure 2D:
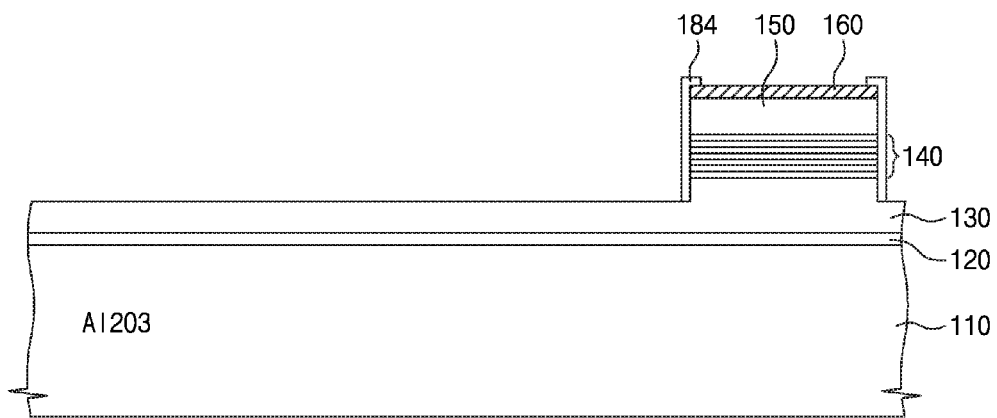

Referring to FIG. 2D, the insulating sidewall material 184a is etched by an etching process to form an insulating sidewall 184 on a sidewall of the emission region. The insulating sidewall 184 may be formed by etching the insulating sidewall material 184a using a mask or by anisotropically etching the insulating sidewall material 184a without using a mask.

Figure 2E:
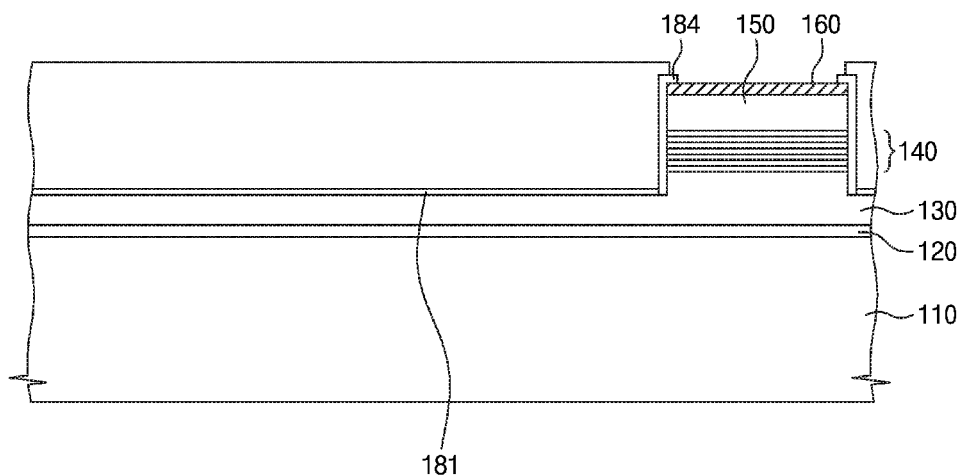

Referring to FIG. 2E, the seed layer 181 may be formed on the n-type GaN layer 130 in the MESA region by a lift-off process. The seed layer 181 may be a layer to grow the transparent window layer 180 in a crystal state. The seed layer 181 may include the same material as the transparent window layer 180. The seed layer 181 may be vertically aligned with the transparent window layer 180.

Then, the transparent window layer 180 is grown on the seed layer 181 in a crystal state. The transparent window layer 180 is grown to be similar to a crystal structure of the seed layer 181. The transparent window layer 180 is grown by a process such as metal organic chemical vapor deposition (MOCVD), hydrothermal deposition or electrochemical deposition. When the transparent widow layer 180 includes zinc oxide, the zinc oxide may be grown by hydrothermal deposition. A top surface of the transparent window layer 180 may be higher than the current spreading layer 160. Thus, a light traveling to a side surface of the emission region may be emitted to the outside after passing through the transparent window layer 180.

Figure 2F:
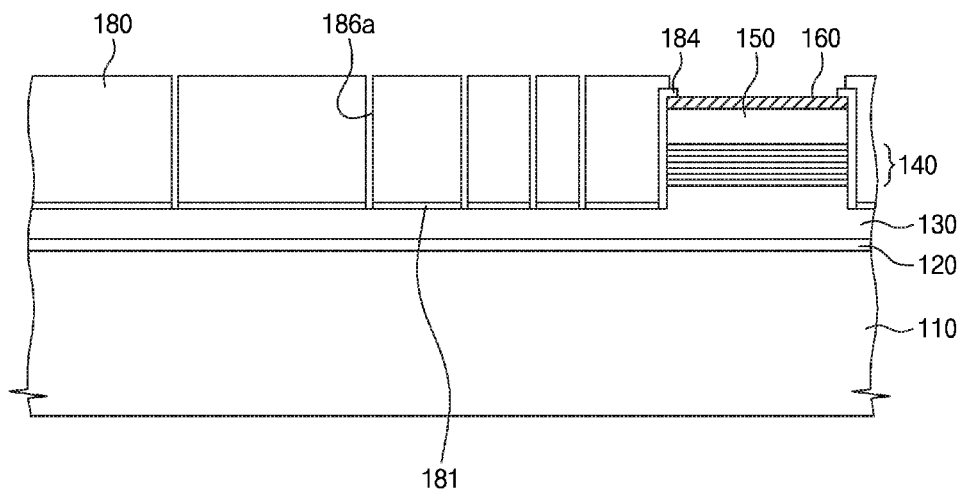

Referring to FIG. 2F, a patterning process is performed on the transparent window layer 180 to form via holes 186a. The via holes 186a may be arranged parallel to each other in the first direction and may be aligned with the n-electrode 182.

Figure 2G:
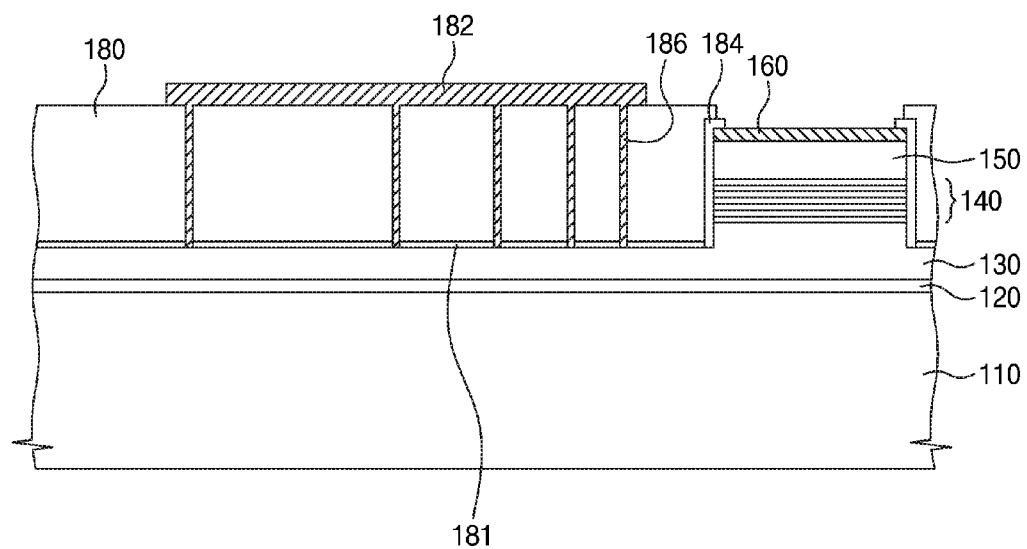

Referring to FIG. 2G, a mask which opens a position where the n-electrode 182 is to be formed is formed by a lift-off process. A metal material is deposited on the substrate 110 where the mask is formed. The via holes 186a are filled with the metal material to form a contact plug 186. Simultaneously, the metal material may form the n-electrode 182 on the transparent window layer 180 by an opened mask. The material forming the n-electrode 182 and the contact plug 186 may have a Cr/Au structure, a Cr/Al/Pt/Au structure, a Ti/Au structure, a Ti/Al structure or a Ti/Al/Ni/Au structure.

Returning to FIG. 1B, the p-electrode 172 may be formed on the current spreading layer 160 by a lift-off process. The p-electrode 172 may have a Ti or Cr-based multilayer structure such as Ni/Au, Ti/Al, Ti/Al/Ni/Au, Cr/Al or Cr/Al/Ni/Au.

Figure 3A:
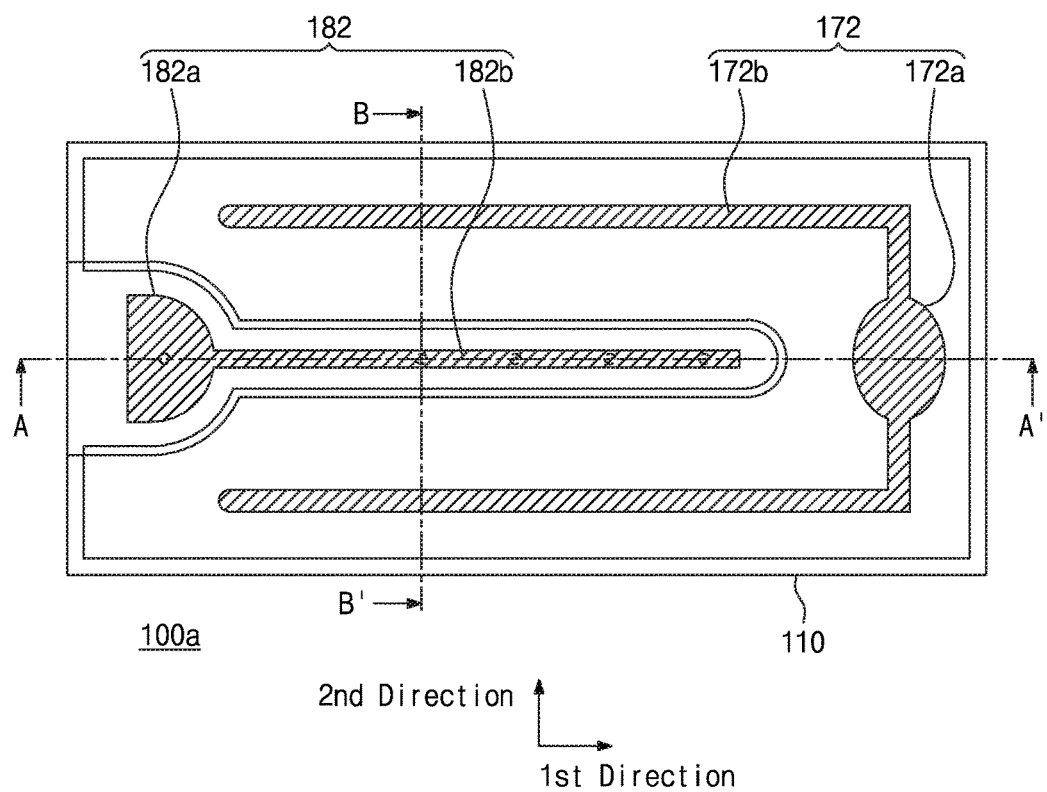
FIG. 3A is a top plan view of a light emitting diode device according to another example embodiment of the present disclosure.

FIG. 3A is a top plan view of a light emitting diode device according to another example embodiment of the present disclosure.

Figure 3B:
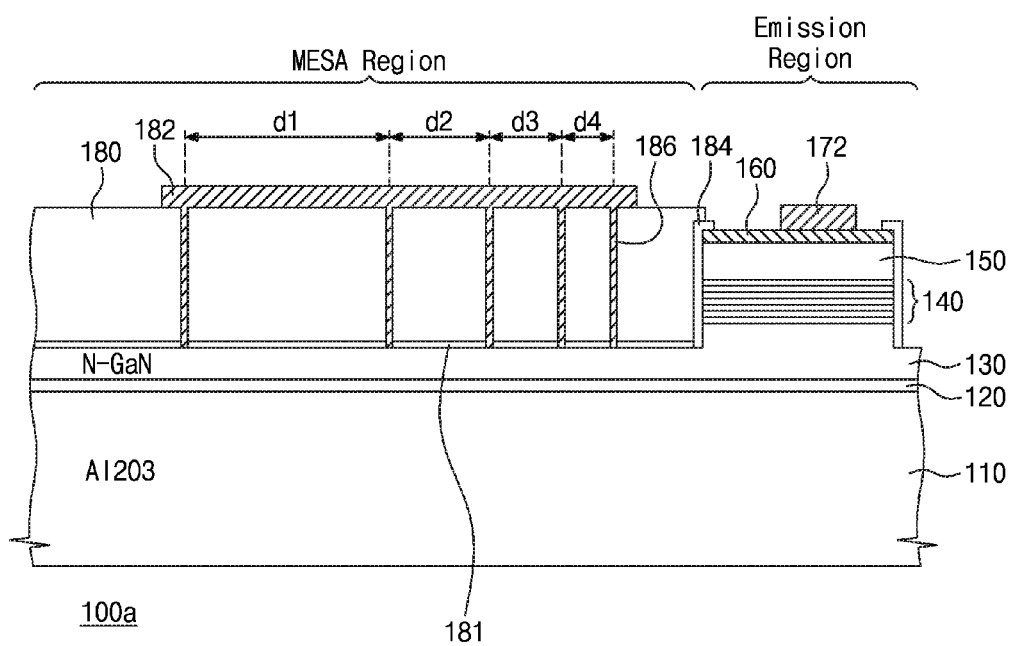
FIG. 3B is a cross-sectional view taken along a line A-A' in FIG. 3A.

FIG. 3B is a cross-sectional view taken along a line A-A' in FIG. 3A.

Figure 3C:
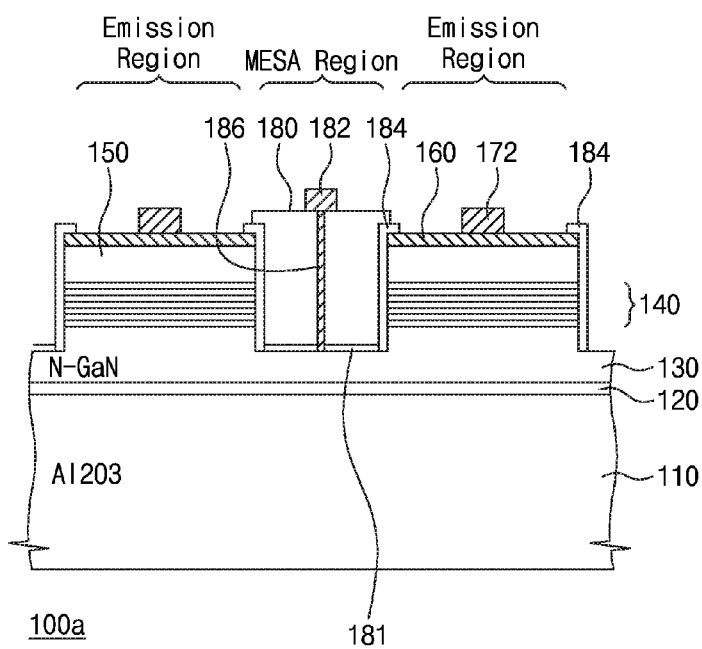
FIG. 3C is a cross-sectional view taken along a line B-B' in FIG. 3A.

FIG. 3C is a cross-sectional view taken along a line B-B' in FIG. 3A.

Referring to FIGS. 3A to 3C, a lateral light emitting diode device 100a includes: a substrate 110; an n-type GaN layer 130 disposed on the substrate 110; an activation layer 140 disposed on the n-type GaN layer 130; a p-type GaN layer 150 disposed on the activation layer 140; a current spreading layer 160 disposed on the p-type GaN layer 150; a p-electrode 172 disposed on the current spreading layer 160; a MESA region formed by removing portions of the current spreading layer 160, the p-type GaN layer 150, the activation layer 140, and the n-type GaN layer 130; a transparent window layer 180 disposed on the n-type GaN layer 130 in the entire or part of the MESA region; a plurality of contact plugs 186 which is in contact with the n-type GaN layer 130 through the transparent window layer 180; and an n-electrode 182 disposed on the transparent window layer 180 to connect the plurality of contact plugs 186 to each other. The current spreading layer 160, the p-type GaN layer 150, and the activation layer 140 are vertically aligned with each other to provide an emission region.

The MESA region may include a peripheral MESA region disposed to cover the emission region and an n-electrode MESA region extending to the emission region. The transparent window layer 180 may be disposed only in the n-electrode MESA region. The seed layer 181 may be removed in the peripheral MESA region.

Figure 4A:
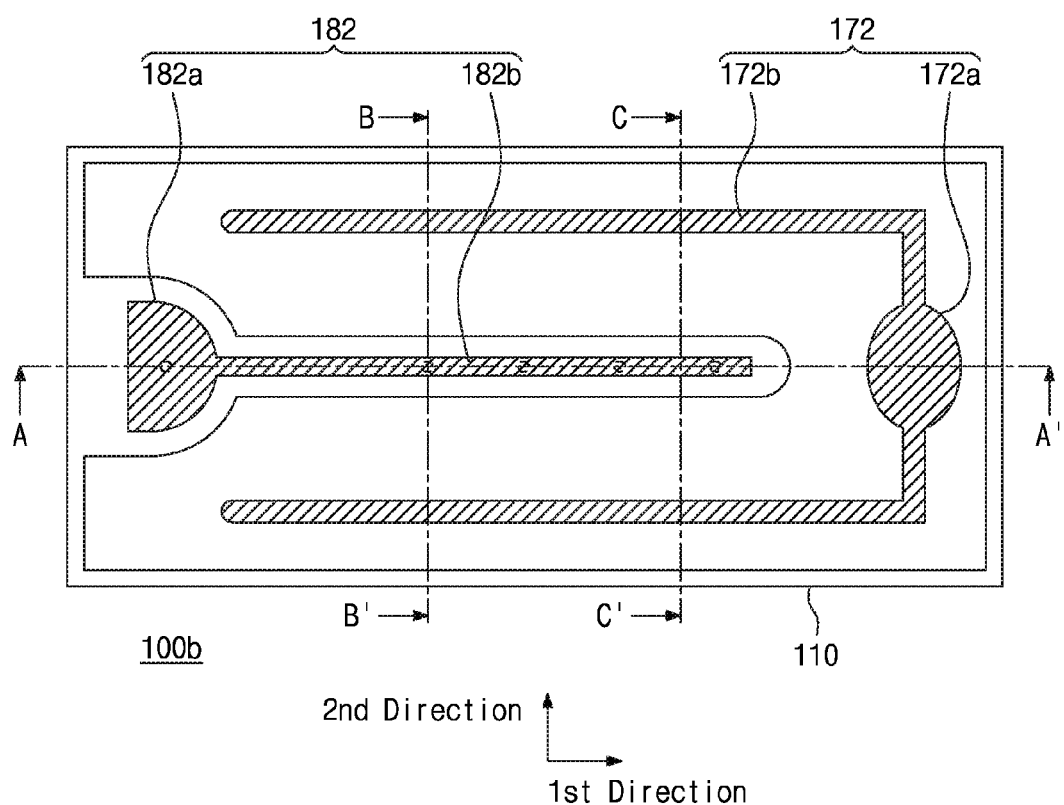
FIG. 4A is a top plan view of a light emitting diode device according to another example embodiment of the present disclosure.

FIG. 4A is a top plan view of a light emitting diode device according to another example embodiment of the present disclosure.

Figure 4B:
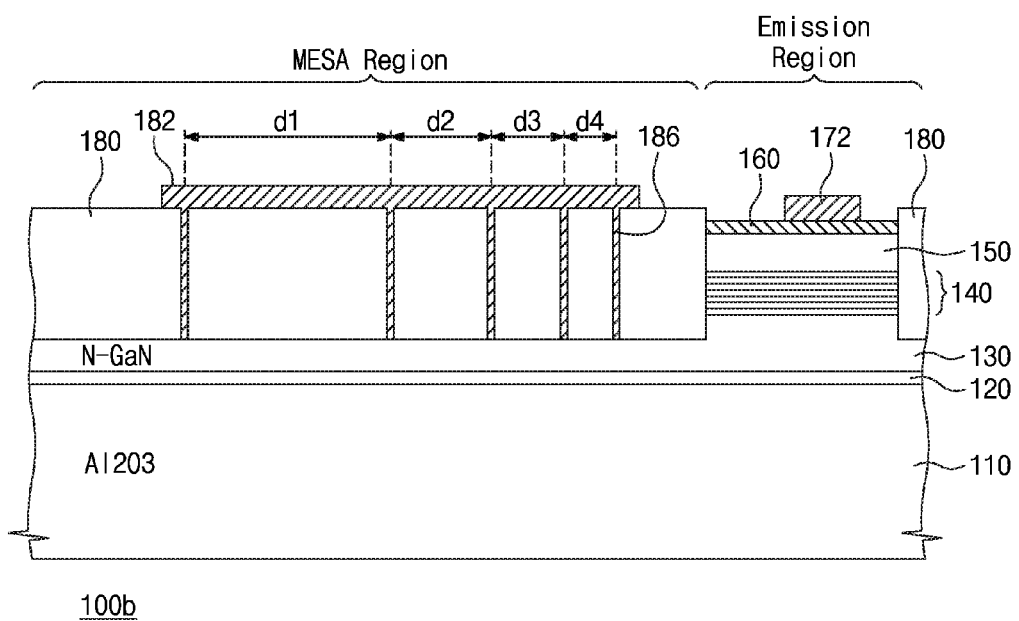
FIG. 4B is a cross-sectional view taken along a line A-A' in FIG. 4A.

FIG. 4B is a cross-sectional view taken along a line A-A' in FIG. 4A.

Figure 4C:
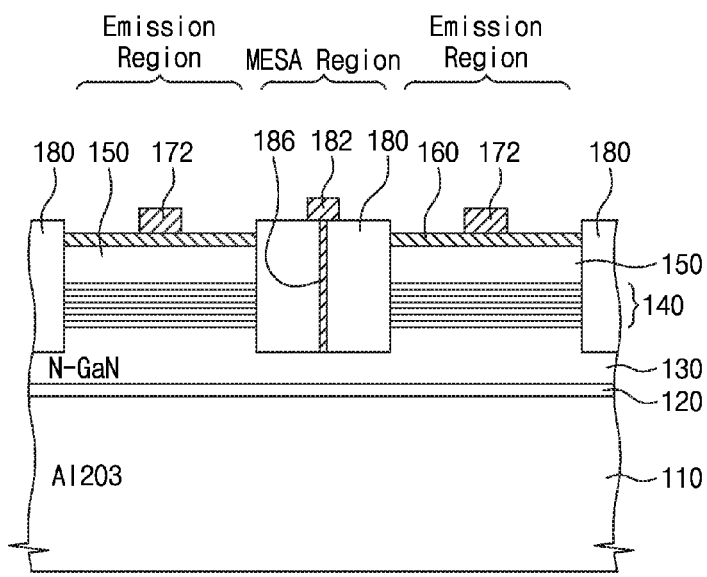
FIG. 4C is a cross-sectional view taken along a line B-B' in FIG. 4A.

FIG. 4C is a cross-sectional view taken along a line B-B' in FIG. 4A.

Referring to FIGS. 4A to 4C, a lateral light emitting diode device 100b includes: a substrate 110; an n-type GaN layer 130 disposed on the substrate 110; an activation layer 140 disposed on the n-type GaN layer 130; a p-type GaN layer 150 disposed on the activation layer 140; a current spreading layer 160 disposed on the p-type GaN layer 150; a p-electrode 172 disposed on the current spreading layer 160; a MESA region formed by removing portions of the current spreading layer 160, the p-type GaN layer 150, the activation layer 140, and the n-type GaN layer 130; a transparent window layer 180 disposed on the n-type GaN layer 130 in the entire or part of the MESA region; a plurality of contact plugs 186 which is in contact with the n-type GaN layer 130 through the transparent window layer 180; and an n-electrode 182 disposed on the transparent window layer 180 to connect the plurality of contact plugs 186 to each other. The current spreading layer 160, the p-type GaN layer 150, and the activation layer 140 are vertically aligned with each other to provide an emission region.

The transparent window layer 180 may include a transparent non-conductive material. For example, the transparent window layer 180 may include silicon oxide, silicon nitride or magnesium fluoride. Thus, an insulating sidewall may be removed. In addition, a seed layer disposed below the transparent window layer 180 may be removed. After the transparent window layer 180 is deposited by chemical vapor deposition or the like, the transparent window layer 180 on the emission region may be removed by a patterning process.

According to a modified embodiment of the present disclosure, the transparent window layer 180 may have a multilayer structure having a reduced refractive index.

FIGS. 5A to 5D are cross-sectional views illustrating a method for fabricating a light emitting diode device according to another example embodiment of the present disclosure.

A method for fabricating a lateral light emitting diode device according to another example embodiment of the present disclosure includes: sequentially stacking an n-type GaN layer 130, an activation layer 140, a p-type GaN layer 150, and a current spreading layer 160 on a substrate 110; anisotropically etching and removing portions of the current spreading layer 160, the p-type GaN layer 150, the activation layer 140, and the n-type GaN layer 130 by using a patterning process to form a MESA region; depositing a transparent window layer on the substrate 110 including the MESA region and forming the transparent window layer 180 only in the MESA region by using a patterning process; forming a plurality of contact plugs 186 to penetrate the transparent window layer 180; forming an n-electrode 182 on the transparent window layer 180 to connect the plurality of contact plugs 186 to each other; and forming a p-electrode 172 on the current spreading layer 160. The transparent window layer 180 may include silicon oxide, silicon nitride or magnesium fluoride.

Figure 5A:
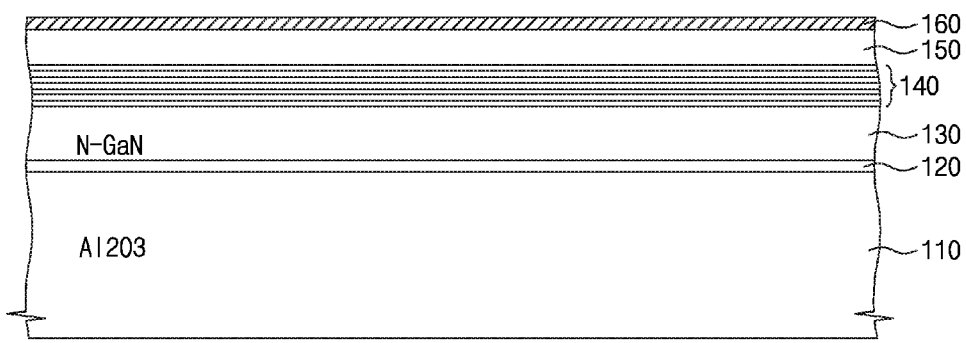
FIGS. 5A to 5D are cross-sectional views illustrating a method for fabricating a light emitting diode device according to another example embodiment of the present disclosure.

Referring to FIG. 5A, the n-type GaN layer 130, the activation layer 140, and the p-type GaN layer 150 are sequentially grown on the substrate 110. Before the n-type GaN layer 150 is grown on the substrate 110, a buffer layer 120 may be grown on the substrate 110. The buffer layer 120 reduces a difference in grating constant between the substrate 110 and the n-type GaN layer 130. The buffer layer 120 serves to relieve stress between the substrate 110 and the n-type GaN layer 130. The buffer layer 120, the n-type GaN layer 130, the activation layer 140, and the p-type GaN layer 150 may be grown by a deposition process such as metal-organic chemical vapor deposition (MOCVD), molecular beam epitaxy (MBE) or hydride vapor phase epitaxy (HVPE).

After the p-type GaN layer 150 is deposited, the current spreading layer 160 is deposited on the p-type GaN layer 150. The current spreading layer 160 is deposited on the p-type GaN layer 150 by a sputtering process.

Figure 5B:
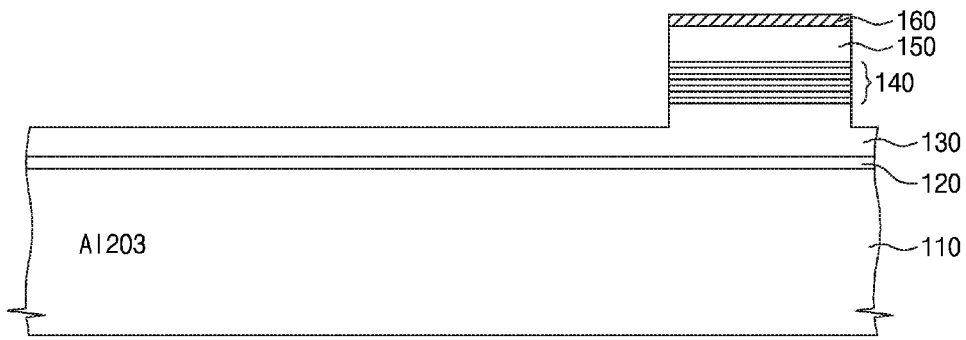

Referring to FIG. 5B, a photoresist (PR) pattern is formed on the current spreading layer 160. Portions of the current spreading layer 160, the p-type GaN layer 150, and the n-type GaN layer 130 are patterned using the photoresist pattern as an etching mask. A plasma anisotropic etching process is performed to form a MESA region and a MESA structure. After the patterning, the photoresist pattern is removed.

Figure 5C:
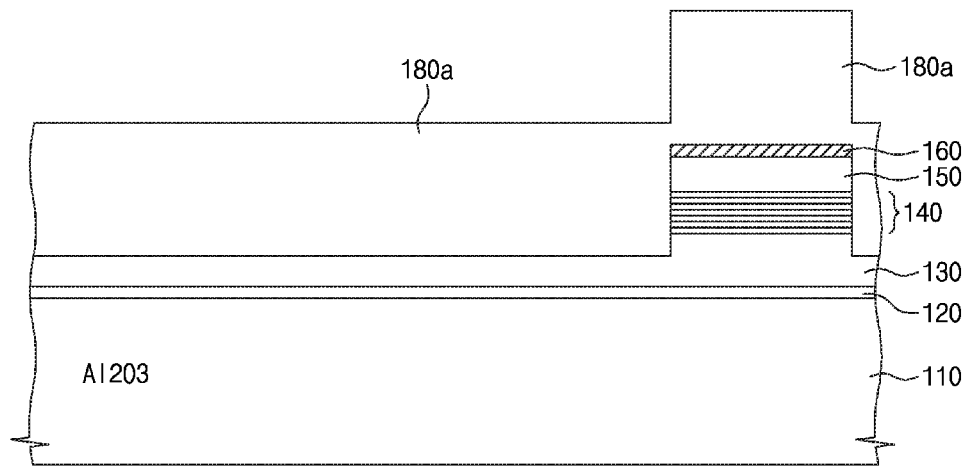

Referring to FIG. 5C, the transparent window layer 180 is deposited by a chemical vapor deposition (CVD) process. The transparent window layer 180 may include silicon oxide, silicon nitride or magnesium fluoride. The transparent window layer 180 may have a multilayer structure having a sequentially reduced refractive index.

Figure 5D:
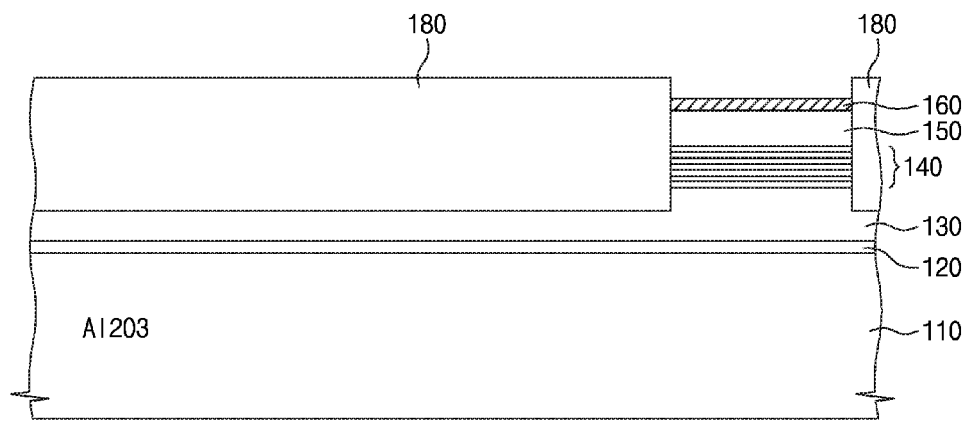

Referring to FIG. 5D, the emission region is opened using a photomask. The transparent window layer 180 is formed only in the MESA region by performing an anisotropic etching process using the photomask.

Returning to FIG. 4B, a plurality of contact plugs 186 are formed to penetrate the transparent window layer 180. An n-electrode 182 is formed on the transparent window layer 180 to connect the plurality of contact plugs 186 to each other. Then, a p-electrode 172 is formed on the current spreading layer 160.

According to the above-described light emitting diode device, a light emitting window structure formed of a low refractive index material is grown in a non-emission region (MESA region) of a diode chip where optical attenuation occurs intensively. Thus, optical attenuation may be presented and light extraction efficiency may be maximized. Moreover, a non-uniform via hole contact may be formed to provide current spreading effect.

Although the present disclosure and its advantages have been described in detail, it should be understood that various changes, substitutions and alterations can be made herein without departing from the spirit and scope of the disclosure as defined by the following claims.

What is claimed is:

1. A lateral light emitting diode device comprising:
   a substrate;
   an n-type GaN layer on the substrate;
   an emission region comprising:
      an activation layer on the n-type GaN layer,
      a p-type GaN layer on and vertically aligned the activation layer, and
      a current spreading layer on and vertically aligned with the p-type GaN layer;
   a p-electrode on the current spreading layer;
   a transparent window layer on the n-type GaN layer in a MESA region of the lateral light emitting diode device;
   a plurality of contact plugs in contact with the n-type GaN layer through the transparent window layer; and
   an n-electrode on the transparent window layer to connect the plurality of contact plugs to each other,
   wherein the n-electrode and the MESA region extend in a first direction, the plurality of contact plugs are arranged in the first direction, and a distance between adjacent ones of the contact plugs sequentially decreases proceeding in the first direction.

2. The lateral light emitting diode device as set forth in claim 1, wherein:
   a top surface of the transparent window layer is higher than the current spreading layer.

3. The lateral light emitting diode device as set forth in claim 1, further comprising at least one of:
   an insulating sidewall on a side surface of the transparent window at the boundary of the MESA region and the emission region; and
   a seed layer between the n-type GaN layer and the transparent window layer.

4. The lateral light emitting diode device as set forth in claim 3, wherein:
   the transparent window layer includes at least one selected from the group consisting of zinc oxide (ZnO), zirconium oxide ($ZrO_2$), titanium oxide ($TiO_2$), chromium oxide, indium tin oxide (ITO), indium zinc oxide (IZO), indium zinc tin oxide (IZTO), indium oxide ($In_2O_3$), tin oxide ($SnO_2$), silicon oxide ($SiO_2$), magnesium fluoride ($MgF_2$), and a combination thereof.

5. The lateral light emitting diode device as set forth in claim 1, wherein:
   the transparent window layer has a multilayer structure having a sequentially reduced refractive index.

6. The lateral light emitting diode device as set forth in claim 1, wherein:
   the MESA region includes a peripheral MESA region covering part of the emission region and an n-electrode MESA region crossing part of the emission region, and
   the transparent window layer is only in the n-electrode MESA region.

7. The lateral light emitting diode device as set forth in claim 1, further comprising:
   an insulating sidewall on a side surface of the transparent window at the boundary of the MESA region and the emission region; and
   a seed layer between the n-type GaN layer and the transparent window layer.

8. The lateral light emitting diode device as set forth in claim 1, wherein the transparent window layer comprises a metal oxide.

9. The lateral light emitting diode device as set forth in claim 1, wherein the transparent window layer comprises a multilayer structure in which each sequential layer has a smaller refractive index.

10. The lateral light emitting diode device as set forth in claim 9, wherein the multilayer structure comprises ZnO, indium tin oxide (ITO), silicon nitride and/or a silicon oxide.

11. The lateral light emitting diode device as set forth in claim 9, wherein the multilayer structure comprises, in sequence, ZnO, indium tin oxide (ITO), silicon nitride and a silicon oxide.

12. The lateral light emitting diode device as set forth in claim 1, wherein the MESA region includes an n-electrode MESA region crossing part of the emission region, and the transparent window layer is in the n-electrode MESA region.

13. The lateral light emitting diode device as set forth in claim 1, wherein the substrate has a crystal structure and orientation similar to the n-type GaN layer, the activation layer and the p-type GaN layer, and is configured to epitaxially grow the n-type GaN layer, the activation layer, and the p-type GaN layer.

14. The lateral light emitting diode device as set forth in claim 1, wherein the substrate comprises sapphire, silicon carbide (SiC), aluminum nitride (AlN), aluminum oxide ($Al_2O_3$), or silicon.

15. The lateral light emitting diode device as set forth in claim 1, further comprising a buffer layer on the substrate, wherein the buffer layer reduces a difference in a grating constant between the substrate and the n-type GaN layer and/or relieves stress between the substrate and the n-type GaN layer.

16. A lateral light emitting diode device comprising:
   a substrate;
   an emission region comprising:
      an n-type GaN layer on the substrate;
      an activation layer on the n-type GaN layer;
      a p-type GaN layer on the activation layer;
      a current spreading layer on the p-type GaN layer;
      a p-electrode on the current spreading layer;
   a transparent window layer on the n-type GaN layer in a MESA region of the lateral light emitting diode device, wherein the transparent window layer has a multilayer structure having a sequentially reduced refractive index;
   a plurality of contact plugs in contact with the n-type GaN layer through the transparent window layer; and
   an n-electrode on the transparent window layer to connect the plurality of contact plugs to each other.

17. The lateral light emitting diode device as set forth in claim 16, wherein the multilayer structure comprises ZnO, indium tin oxide (ITO), silicon nitride and/or a silicon oxide.

18. The lateral light emitting diode device as set forth in claim 16, wherein the multilayer structure comprises, in sequence, ZnO, indium tin oxide (ITO), silicon nitride and a silicon oxide.

19. The lateral light emitting diode device as set forth in claim 16, wherein the transparent window layer has a top surface that is higher than a top surface of the current spreading layer.

* * * * *